(12) United States Patent
Suzumura

(10) Patent No.: US 12,159,876 B2
(45) Date of Patent: Dec. 3, 2024

(54) DISPLAY DEVICE

(71) Applicant: Japan Display Inc., Tokyo (JP)

(72) Inventor: Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/459,677

(22) Filed: Sep. 1, 2023

(65) Prior Publication Data

US 2023/0411401 A1    Dec. 21, 2023

Related U.S. Application Data

(63) Continuation of application No. 17/694,754, filed on Mar. 15, 2022, now Pat. No. 11,791,346, which is a
(Continued)

(30) Foreign Application Priority Data

Jan. 11, 2018   (JP) .................................. 2018-002641

(51) Int. Cl.
*H01L 29/40*     (2006.01)
*G02F 1/1368*    (2006.01)
(Continued)

(52) U.S. Cl.
CPC ........ *H01L 27/1225* (2013.01); *G02F 1/1368* (2013.01); *H01L 27/1248* (2013.01);
(Continued)

(58) Field of Classification Search
CPC ............. H01L 21/426; H01L 21/02365; H01L 21/32053; H01L 21/823475; H01L 27/1225; H01L 27/12; H01L 27/1248; H01L 27/1229; H01L 27/127; H01L 29/401; H01L 29/40; H01L 29/42384; H01L 29/423; H01L 29/66969; H01L 29/66; H01L 29/786; H01L 29/4908; H01L 29/49; H01L 29/78633; H01L 29/78648; H01L 29/7869; H10K 59/126;
(Continued)

(56) References Cited

U.S. PATENT DOCUMENTS

2013/0187151 A1    7/2013   Yamazaki
2017/0117374 A1    4/2017   Tanaka

OTHER PUBLICATIONS

Chinese Office Action dated Aug. 23, 2024 for the corresponding Chinese Application No. 202210280593.

*Primary Examiner* — Nikolay K Yushin
(74) *Attorney, Agent, or Firm* — Michael Best & Friedrich LLP

(57) ABSTRACT

The purpose of the present invention is to decrease the resistance of the drain and source in the TFT of the oxide semiconductor as well as to have stable Vd-Id characteristics of the TFT. The structure of the present invention is as follows: A display device having plural pixels including thin film transistors (TFT) having oxide semiconductor films comprising: a gate insulating film formed on the oxide semiconductor film, an aluminum oxide film formed on the gate insulating film, a gate electrode formed on the aluminum oxide film, a side spacer formed on both sides of the gate electrode, and an interlayer insulating film formed on the gate electrode, the side spacer, a drain and a source, wherein in a plan view, and in a direction from the drain to the source, a length of the gate electrode is shorter than a length of the aluminum oxide film.

5 Claims, 12 Drawing Sheets

Related U.S. Application Data continuation of application No. 16/922,438, filed on Jul. 7, 2020, now Pat. No. 11,309,336, which is a continuation of application No. PCT/JP2018/043661, filed on Nov. 28, 2018.

(51) Int. Cl.
  *H01L 27/12* (2006.01)
  *H01L 29/423* (2006.01)
  *H10K 59/126* (2023.01)
  *H01L 21/426* (2006.01)

(52) U.S. Cl.
  CPC ...... *H01L 29/401* (2013.01); *H01L 29/42384* (2013.01); *H10K 59/126* (2023.02); *G02F 1/13685* (2021.01); *H01L 21/426* (2013.01)

(58) Field of Classification Search
  CPC .............. H10K 59/121; H10K 59/1213; G02F 1/1368; G02F 1/13685; G09F 9/30
  See application file for complete search history.

DISPLAY DEVICE

This application is a continuation application of U.S. patent application Ser. No. 17/694,754, filed on Mar. 15, 2022, which, in turn, is a continuation application of U.S. patent application Ser. No. 16/922,438 (now U.S. Pat. No. 11,309,336), filed on Jul. 7, 2020, which, in turn, is a continuation application of International Application No. PCT/JP2018/043661, filed on Nov. 28, 2018, which claims priority to Japanese Patent Application No. 2018-002641, filed on Jan. 11, 2018. The contents of these applications are incorporated herein by reference in their entirety.

BACKGROUND OF THE INVENTION

(1) Field of the Invention

The present invention relates to the display device using oxide semiconductor TFTs.

(2) Description of the Related Art

The organic EL display device has the driving transistor and the switching transistor, which are formed by TFT (Thin Film Transistor), in the pixel; the liquid crystal display device has a switching transistor in the pixel. Therefore, the characteristics of the TFT is important.

The oxide semiconductor has high OFF resistance, therefore, OFF current can be made low when it is used in the TFT. Consequently, a fluctuation in the pixel voltage can be made low. In addition, the TFTs using the oxide semiconductor can be formed in lower temperature in the manufacturing process than that of the TFTs using the polysilicon semiconductor; thus, the display device using the resin substrate can be realized.

In the TFT, the electric field is concentrated at region between the channel and the drain; thus, there is a chance that a break down occurs in this region. Therefore, in the TFT that uses the polysilicon semiconductor, forms the LDD (Lightly Doped Drain) region between the channel and the drain to avid the break down.

In the TFT of the oxide semiconductor, hydrogen is supplied to the drain region and the source region to give conductivity in those regions. Patent document 1 discloses to diffuse the hydrogen, which is in the drain and the source, into the region between the channel and the drain or the source to form the same effect as LDD, namely, to form the region that has lower resistance than that of the channel and higher resistance than that of the drain or the source.

PRIOR ART DOCUMENTS

Patent Document 1

Japanese patent application laid open No. 2017-85079

SUMMARY OF THE INVENTION

Forming the medium resistance region by diffusing hydrogen under the gate electrode, as disclosed in patent document 1, is difficult to control the diffusing area of the hydrogen. Especially, when the channel length is short, there is a danger that the TFT is depleted. If more hydrogen is supplied to the drain and the source to decrease their resistance, the danger of depletion of the TFT increases.

The purpose of the present invention is to form stably the intermediate region between the channel and the drain or the source. Another purpose of the present invention is to form the TFT of the oxide semiconductor having stable characteristics.

The present invention overcomes the above explained problem; the concrete structures are as follows.

(1) A display device having plural pixels including thin film transistors (TFT) having oxide semiconductor films comprising:
   a gate insulating film formed on the oxide semiconductor film,
   an aluminum oxide film formed on the gate insulating film,
   a gate electrode formed on the aluminum oxide film,
   a side spacer formed on both sides of the gate electrode,
   an interlayer insulating film formed on the gate electrode, the side spacer, a drain and a source,
   wherein in a plan view, and in a direction from the drain to the source, a length of the gate electrode is shorter than a length of the aluminum oxide film.

(2) The display device according to (1),
   wherein, in a plan view, a channel is formed in the oxide semiconductor film at a place where the gate electrode contacts with the aluminum oxide film and overlaps with the oxide semiconductor film,
   the intermediate region is formed in the oxide semiconductor film at a place where the side spacer contacts with the aluminum oxide film and overlaps with the oxide semiconductor film.

(3) The display device according to (1),
   wherein the interlayer insulating film directly contacts with the drain and the source of the oxide semiconductor film.

(4) The display device according to (1),
   wherein the drain and the source of the oxide semiconductor film are covered by the gate insulating film, the gate insulating film contacts with the interlayer insulating film.

DETAILED DESCRIPTION OF THE PREFERRED EMBODIMENTS

The present invention will be explained in detail referring to the following embodiments. Examples of the oxide semiconductors are indium gallium zinc oxide (IGZO), indium tin zinc oxide (ITZO), zinc oxide nitride (ZnON), and indium gallium oxide (IGO). Among the oxide semiconductors, optically transparent and amorphous materials are called TAOS (Transparent Amorphous Oxide Semiconductor). The oxide semiconductor may be called TAOS in this specification. In embodiments 1 and 2, the present invention is explained when it is applied in the organic EL display device; in embodiment 3, the present invention is explained when it is applied in the liquid crystal display device.

Embodiment 1

Figure 1:
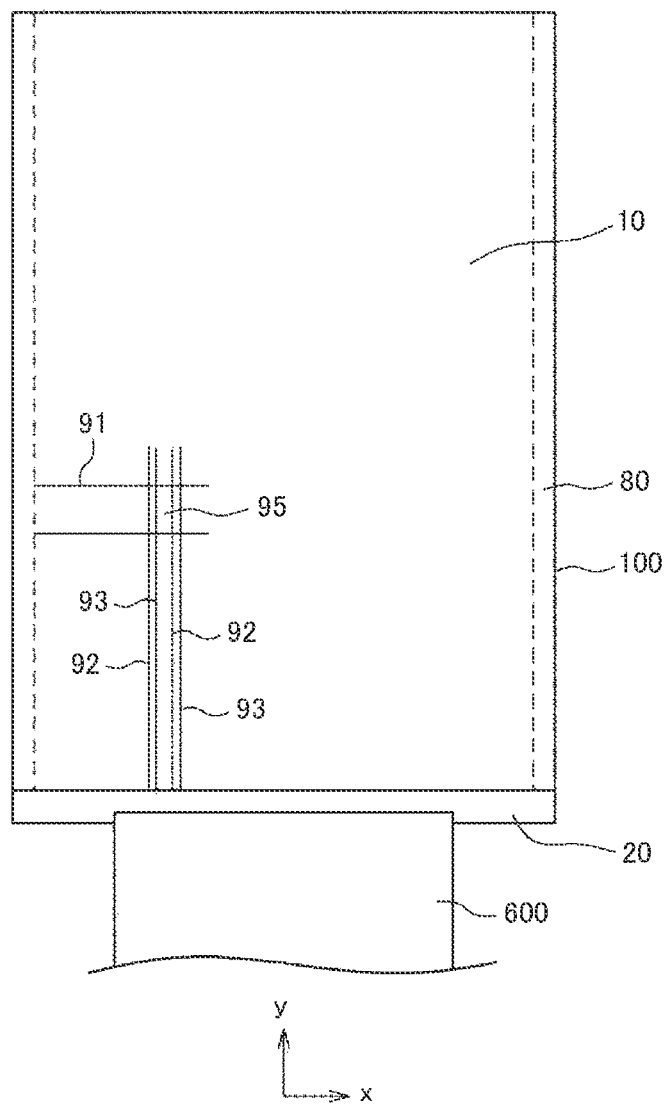
FIG. 1 is a plan view of the organic EL display device.

In FIG. 1, the scan line driving circuits 80 are formed at both sides of the display area 10. In the display area 10, the scan lines 91 extend in the lateral direction (x direction) and are arranged in the longitudinal direction (y direction). The video signal lines 92 and the power lines 93 extend in the longitudinal direction and are arranged in the lateral direction. The area surrounded by the scan lines 91 and the video signal lines 92 or the power lines 93 is the pixel 95; the driving transistor and the switching transistor, which are made of TFTs, the organic EL layer, which emits light, and so forth are formed in the pixel 95.

The terminal area 20 is formed at the one side of the TFT substrate 100. The flexible wiring substrate 600 is connected to the terminal area 20 to supply powers and signals to the organic EL display device. If the TFT substrate 100 is made of glass of 0.2 mm or thinner, the display device can be curved. Further, if the TFT substrate 100 is made of resin as polyimide and so forth, the flexible display device can be formed. Polyimide has superior characteristics for the substrate of the display device because of its mechanical strength and heat resistance and so forth.

Figure 2:
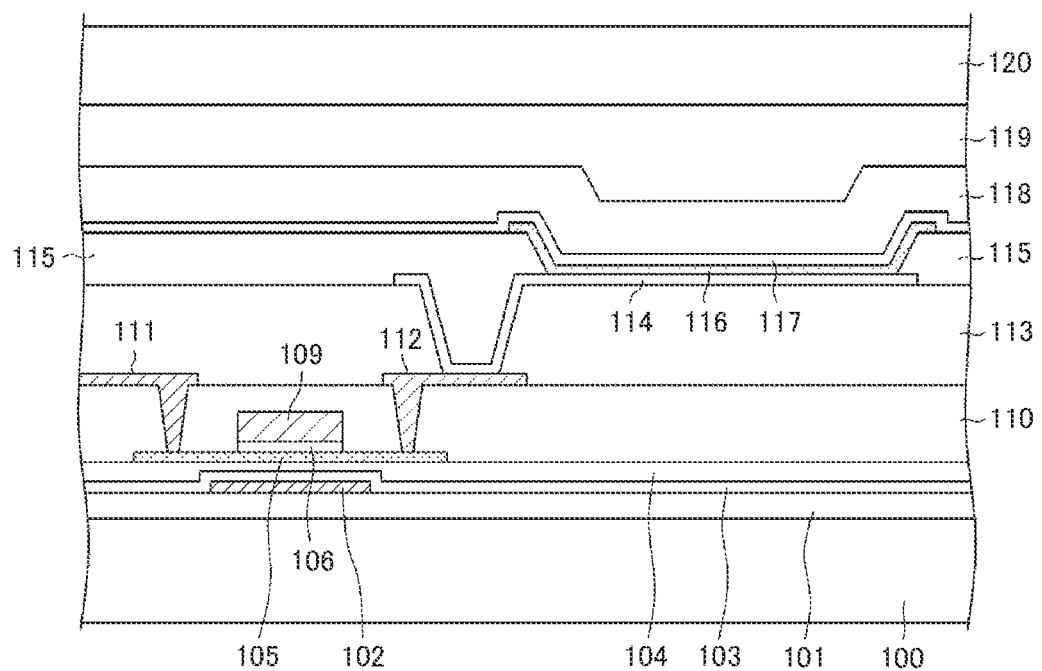
FIG. 2 is a cross sectional view of the display area of the organic EL display device as a comparative example.

FIG. 2 is a cross sectional view of the display area 10 of the organic EL display device as a comparative example. The undercoat film 101 is formed on the TFT substrate 100. The role of the undercoat film 101 is to prevent the oxide semiconductor film 105, which is formed above the undercoat film 101, from being contaminated by impurities in the glass substrate or the resin substrate; another role is to strengthen the adhesiveness between the films in the display device and the resin substrate or the glass substrate.

The undercoat film 101 is e.g. a laminated film of three layers of silicon oxide film (herein after represented by SiO), silicon nitride film (herein after represented by SiN), and SiO film. The lower most SiO film prevents the intrusion of the impurities and maintains adhesiveness with the resin substrate 100 or the polyimide substrate 100 as the TFT substrate 100. The SiN film has a superior barrier characteristic against the impurities, specifically moisture, from the glass substrate 100 or the resin substrate 100. The upper most layer of SiO film has a role as a barrier against the impurities and improves adherence between the layers formed on the SiO film and the substrate 100.

In FIG. 2, the bottom gate electrode 102 is formed on the undercoat film 101. The gate electrode 109 is also formed over the oxide semiconductor film 105, consequently, the TFT in FIG. 2 is a so called dual gate TFT. In the structure of FIG. 2, the influence of the top gate 109 is stronger than that of the bottom gate 102. The bottom gate 102 also has a role as a light shading effect against the light from the rear side.

The bottom gate insulating film, which has a two layer structure, is formed between the bottom gate electrode 102 and the oxide semiconductor film 105; the bottom gate insulating film of two layer structure has the first bottom gate insulating film 103 and the second bottom gate insulating film 104. The first bottom gate insulating film 103 is made of e.g. the silicon nitride (SiN) film of a thickness of 50 nm; the second bottom gate insulating film 104 is made of e.g. the silicon oxide (SiO) film of a thickness of 200 nm.

The oxide semiconductor film 105 is formed on the second gate insulating film 104. The top gate insulating film 106 is formed on the channel of the oxide semiconductor film 105; the top gate electrode 109 is formed on the top gate insulating film 106. The structure of the TFT in FIG. 2 is explained in FIG. 3.

In FIG. 2, the interlayer insulating film 110 is formed covering the TFT. The interlayer insulating film 110 is made of the SiN film or the SiO film, or a laminated film of the SiN film and the SiO film. The interlayer insulating film 110 in FIG. 2 has a role to supply hydrogen to the oxide semiconductor film 105, therefore, it is preferable that the interlayer insulating film 110 contains hydrogen.

The through holes are formed to connect the drain region of the oxide semiconductor 105 and the drain electrode 111, and to connect the source region of the oxide semiconductor 105 and the source electrode 112. The organic flattening film 113 is formed by e.g. acrylic resin covering the interlayer insulating film 110, the drain electrode 111, source electrode 112 and so forth. Since the organic flattening film 113 has a role as a flattening film, it is formed thick as 1.5 to 4 microns.

The through hole is formed in the organic flattening film 113 to connect the lower electrode 114 and the source electrode 112. The lower electrode 114 is a laminated film of the lower layer of the reflection film made of e.g. silver and the upper layer of the anode for the organic EL layer. The anode is made of e.g. ITO (Indium Tin Oxide) film, which is a transparent conductive film.

The bank 115 is formed covering the edge of the lower electrode 114 and the organic flattening film 113, etc. The bank 115 is made of resin as acrylic. The role of the bank 115 is to form a step coverage to prevent the breaking of the organic EL layer 116 at the edge of the lower electrode 114 as well as to partition the pixels 95. The bank 115 is formed as that the material for the bank 115 is formed on all over the display area 10, and subsequently, holes are formed at the areas where the organic EL layers are formed, namely, the light emitting areas are formed.

In FIG. 2, the organic EL layer 116 is formed on the lower electrode 114 in the hole of the bank 113. The organic EL layer 116 comprises e.g., from lower side, the hole injection layer, the hole transport layer, the light emitting layer, the electrode transport layer, and the electron injection layer.

The upper electrode 117, which is a cathode, is formed on the organic EL layer 116 by a transparent electrode. The upper electrode 117 needs to be transparent. The upper electrode 117 is made of the transparent conductive film of e.g. ITO, IZO (Indium Zinc Oxide), AZO (Antimony Zinc Oxide) and so forth or a thin film of metal as silver, etc. When the metal is made to thin film, it becomes transparent. The upper electrode 117 is formed all over the display area 10 in common to the pixels.

The organic EL layer 116 is weak to moisture, and is mechanically weak because it is thin. Therefore, the protective film 118, which is a laminated film of the SiN film, the SiO film and the organic film made of as e.g. acrylic resin, is formed covering the upper electrode 117. The SiN film works as a barrier against moisture, the organic film works as a mechanical buffer, and the SiO film works as a barrier as well as for maintaining adhesive strength with other layers.

Since the organic EL display device has reflection electrodes, the external light is reflected. Therefore, the organic EL display device has the circular polarizing plate 120 adhered to the display surface via the adhesive 119 to prevent the reflection of the external light.

Figure 3:
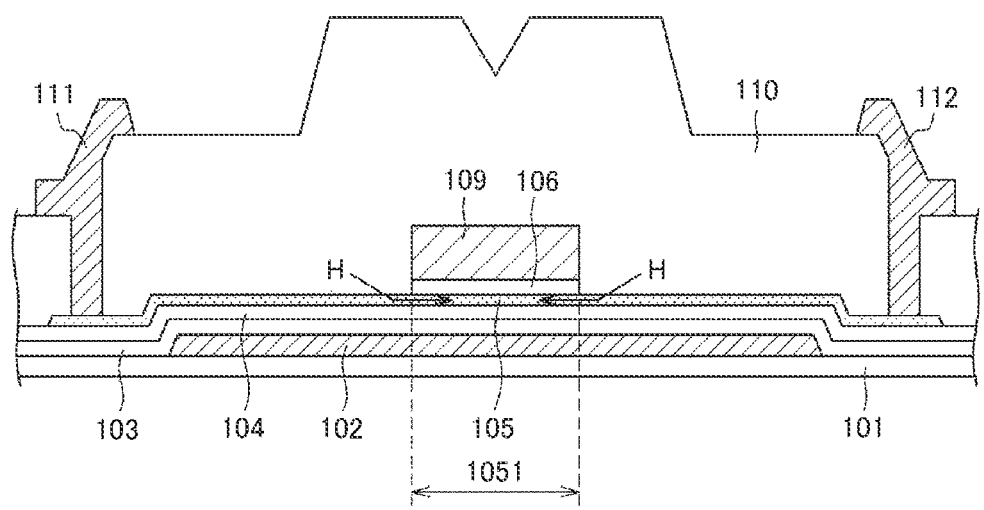
FIG. 3 is a cross sectional view that shows a problem in the structure of FIG. 2.

FIG. 3 is an enlarged view of the TFT portion in FIG. 2. In FIG. 3, the bottom gate electrode 102 made of metal is formed on the undercoat film 101. The first bottom gate insulating film 103 is formed by SiN in a thickness of e.g. 50 nm covering the bottom gate electrode 102. The second bottom gate insulating film 104 is formed by SiO in a thickness of e.g. 200 nm on the first bottom gate insulating film 103. The first bottom gate insulating film 103 and the second bottom gate insulating film 104 can be formed continuously by CVD (Chemical Vapor Deposition).

The oxide semiconductor film 105 is formed on the second bottom gate insulating film 104. The characteristics of the semiconductor film 105 change when it is reduced by hydrogen. Since the SiN film discharges hydrogen, the second bottom gate insulating film 104, which contacts the oxide semiconductor film 105, is formed by SiO. The oxide semiconductor film 105 is formed by e.g. sputtering in a thickness of 10 to 100 nm. The oxide semiconductor film 105 is made of e.g. IGZO.

In FIG. 3, the top gate insulating film 106 is formed by SiO on the channel region of the oxide semiconductor film 105 in a thickness of e.g. 100 nm. The top gate insulating film 106 is formed as that: the SiO film is formed all over the display area and is left only at the place corresponding to the channel region of the oxide semiconductor film 105.

After that, the top gate electrode 109 is formed on the top gate insulating film 106. The thickness of the top gate electrode 109 is e.g. 200 nm. The thickness of the top gate insulating film 106 is 100 nm, while the bottom gate insulating film is a laminated film of the second bottom gate insulating film 104 made of SiO of a thickness of 200 nm and the first bottom gate insulating film 103 made of SiN of a thickness of 50 nm; therefore, Vd-Id characteristics of the TFT are mainly controlled by the top gate electrode 109. Herein after, the top gate electrode 109 may be simply called the gate electrode and the top gate insulating film 106 may be simply called as the gate insulating film.

After that, the interlayer insulating film 110 is formed covering the gate electrode 109 and the oxide semiconductor film 105. In many cases, the interlayer insulating film 110 is a laminated film of the SiN film as the lower layer and the SiO film as the upper layer. The reason why the SiN film is used as the lower layer is to supply hydrogen to the oxide semiconductor film 105 to form the drain region and the source region in the oxide semiconductor film 105. Namely, in the annealing process, hydrogen from the SiN film diffuses into the area of the oxide semiconductor film 105 that is not covered by the gate electrode 109 to give conductivity to the oxide semiconductor film 105. Thus, the drain region and the source region are formed in the oxide semiconductor film 105. Subsequently, through holes are formed in the interlayer insulating film 110 to connect the drain region of the oxide semiconductor film 105 and the drain electrode 111, and to connect the source region of the oxide semiconductor film 105 and the source electrode 112.

On the other hand, the portion of the oxide semiconductor film 105 that is covered by the gate electrode 109 keeps high resistance since hydrogen does not diffuse into this portion. However, hydrogen from the SiN film, which is absorbed in the drain and source of the oxide semiconductor film 105 diffuses in lateral direction in the oxide semiconductor film 105 during the anneal process. Consequently, there occurs a problem that the channel becomes conductive when the channel length is short; even if the channel does not become conductive, the Vd-Id characteristics fluctuate.

Figure 4:
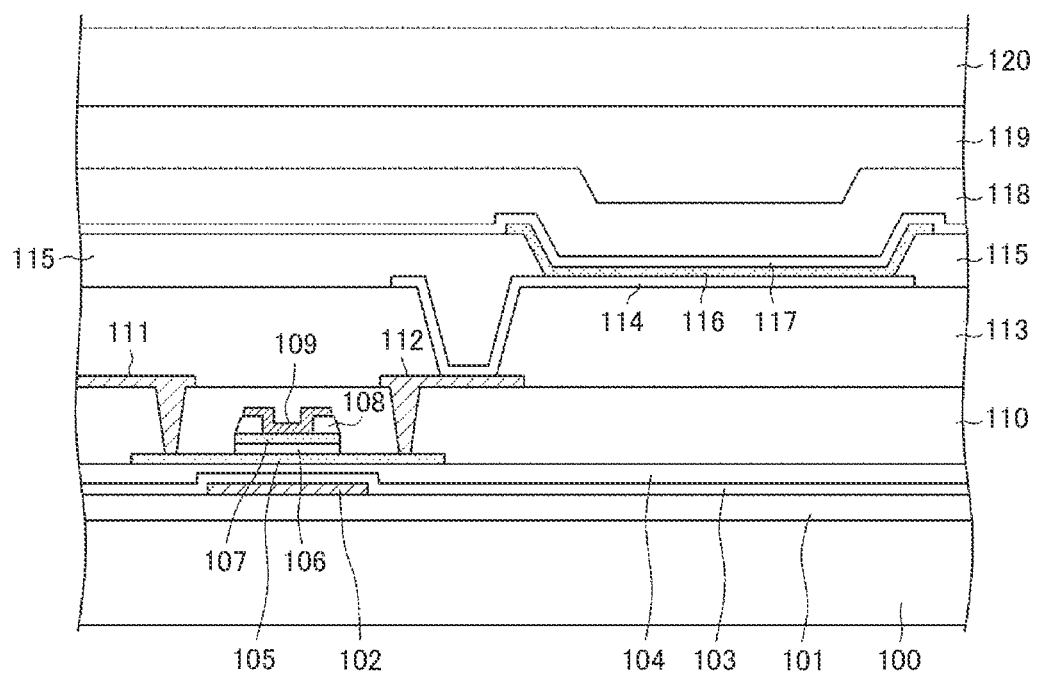
FIG. 4 is a cross sectional view of the display area of the organic EL display device according to the present invention.

The present invention overcomes this problem. FIG. 4 is a cross sectional view of the display area 10 of the organic EL display device according to the present invention. The structure of TFT of the oxide semiconductor 105 and the structure of the interlayer insulating film 110 in FIG. 4 are different from those in FIG. 2. FIG. 4 is the same as FIG. 2 up to the oxide semiconductor film 105, which is formed on the second bottom gate insulting film 104, is patterned.

In FIG. 4, the gate insulating film 106 made of SiO is formed in the area between the drain region and the source region of the oxide semiconductor film 105; the aluminum oxide (herein after AlO) film 107 is formed on the gate insulating film 106. It may be said that the SiO film 106 and the AlO film 107 constitute the gate insulating film, however, in this specification, for convenience, the SiO film is called the gate insulating film 106 and the aluminum oxide film is called AlO film 107.

The gate electrode 109 is formed by metal or alloy on the AlO film 107; the present invention characterizes in that the side spacers 108, made of insulating material as e.g. SiN, are formed at the both sides of the AlO film 107. As explained later, the side spacers 108 securely separate the channel from the drain or the source.

The gate electrode 109 and the gate insulating film 106 are patterned, the drain and the source of the oxide semiconductor film 105 are not covered by the gate insulating film 106 and the gate electrode 109, consequently, they contact directly with the interlayer insulating film 110. The interlayer insulating film 110 is formed by the SiN film or a laminated film of the SiN film and the SiO film. The feature of the present invention is that the SiN film contacts with the drain or the source of the oxide semiconductor film 105. Thus, hydrogen is supplied to the drain and the source of the oxide semiconductor film 105; consequently, the resistance of the drain and the source can be decreased.

Since hydrogen is easy to diffuse, when hydrogen is supplied to the drain and the source, hydrogen diffuses into the channel during the annealing process, in the structure of FIG. 3, which is a comparative example; consequently, characteristics of the TFT become unstable. Further, if the channel is short, there is a danger that the channel becomes conductive. The present invention prevents the TFT of the oxide semiconductor from becoming unstable by forming side spacers 108 at both sides of the gate electrode 109. The structures above the interlayer insulating film are the same as explained in FIG. 2.

Figure 5:
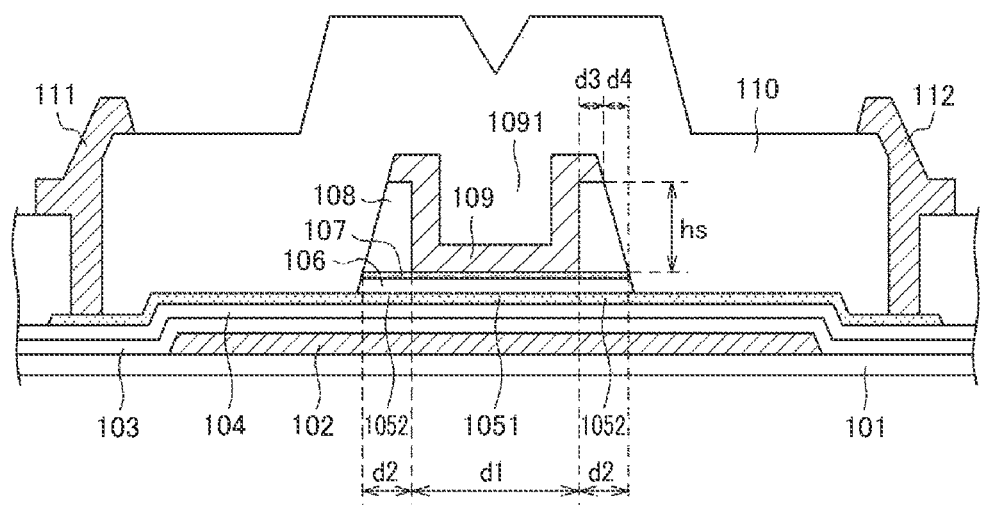
FIG. 5 is a cross sectional view of the TFT portion according to embodiment 1.

FIG. 5 is an enlarged cross sectional view of the TFT in FIG. 4. The gate insulating film 106, the AlO film 107 and the gate electrode 109 are formed on the oxide semiconductor film 105. The side spacers 108 are formed between the edge of the gate electrode 109 and the edge of the AlO film 107. The channel region 1051 of the oxide semiconductor film 105 corresponds to the region that the gate electrode 109 opposes to the oxide semiconductor film 105 without the side spacers 108. In other words, the channel region 1051 of the oxide semiconductor film 105 corresponds to the recessed portion 1091 of the gate electrode 109.

The gate insulating film 106 is formed under the gate electrode 109 only, and is not formed on the drain region and the source region of the oxide semiconductor film 105. After that, the interlayer insulating film 110 is formed by the SiN film covering the gate electrode 109 and the oxide semiconductor film 105 and etc. Since hydrogen is supplied to the region where the oxide semiconductor film 105 contacts with the SiN film, the resistance of the drain and the source of the oxide semiconductor film 105 becomes low, thus, more drain current can flow.

Conventionally, the SiO film that has a lot of defects was brought into contact with the oxide semiconductor film 105 to form the drain and the source; however, supply of hydrogen from the SiO film is less compared with that from the SiN film, thus, the resistance of the drain and the source could not made low enough; consequently, flowing of a large drain current was impossible. On the other hand, if the interlayer insulating film 110 is formed by the SiN film in the conventional structure, hydrogen may be supplied to the oxide semiconductor film 105; however, the hydrogen diffuses into the channel 1051 of the oxide semiconductor film 105, too, and the channel 1051 is made conductive. This problem is more dangerous in the TFT that the channel length is short.

The present invention controls the diffusion of hydrogen into the channel 1051 by forming the side spacers 108 at the both sides of the gate electrode 109; and thus, realizes low resistance in the drain and the source of the oxide semiconductor film 105 and, at the same time, suppresses the influence of hydrogen to the channel 1051. The present invention intensifies the effect by forming the AlO film 107 between the gate insulating film 106 and the gate electrode 109 and between the gate insulating film 106 and the side spacers 108.

In FIG. 5, a thickness of the AlO film 107, which exists between the gate insulating film 106 and the gate electrode 109 and between the gate insulating film 106 and the side spacers 108, is 10 to nm. Supplying oxygen is effective to suppress fluctuation of characteristics of the channel in the oxide semiconductor film 105. The AlO film 107 also can supply oxygen, therefore, the oxide semiconductor film 105 can be supplied with oxygen more stably.

The cross sectional view of the side spacer 108 formed on the AlO film 107 is trapezoidal that one side wall has a tapered surface. The offset region 1052 is formed in the oxide semiconductor film 105. The offset region 1052 securely forms the intermediate region between the channel and the drain and between the channel and the source (herein after the source is represented by the drain) in the oxide semiconductor film 105; even too much hydrogen is supplied to the drain or the source, the intermediate region prevents the channel from being influenced by hydrogen, thus, the fluctuation in characteristics of the TFT can be avoided. This is specifically effective when the channel length is short.

In FIG. 5, a length d2 of the offset region 1052 is 0.5 to 2 microns. When the channel length d1 is e.g. 2 microns, a length d2 of the offset region 1052 is preferably approximately 1 micron. The AlO film 107 exists between the offset region 1052 and the side spacer 108. Since the AlO film 107 is a good supplier of oxygen, the offset region 1052 effectively offsets hydrogen that tries to diffuse into the channel from the drain, and thus, effectively prevents the channel from being reduced by hydrogen.

In FIG. 5, the edge of the gate electrode 109 extends on the top of the side spacer 108 to form the gate electrode 109 stably. The length d3 of the gate electrode 109 on the top of the side spacer 108 is preferably 0.1 microns or more. The length d4 between the edge of the gate electrode 109 and the outer edge of the offset region 1052 is preferably 0.3 microns or more. The width of the offset region d2 is d3+d4.

In FIG. 5, one side surface of the side spacer 108 is a tapered surface. The reason why the tapered surface is made is to improve a step coverage for the interlayer insulating film 110, which is formed covering the gate electrode 109 and the side spacers 108. Therefore, the tapered surface of the side spacer 108 is not necessarily indispensable in the present invention.

A thickness of the side spacer 108 is e.g. 100 to 500 nm. If the side spacer 108 is too thin, the side spacer 108 disappears during patterning by dry etching. On the other hand, if the side spacer 108 is too thick, the following problems occur: namely, a problem of a step coverage by the interlayer insulating film 110, which covers the gate electrode 109 and the side spacer 108, and a problem that manufacturing time of the side spacer 108 becomes too long, and so on. In addition, if the side spacer 108 is too thick, when the side spacer is made of SiN, there occurs a problem that supplying hydrogen form the side spacer 108 itself increases.

The interlayer insulating film 110 is formed covering the gate electrode 109 and the side spacer 108. The interlayer insulating film 110 generally has a two-layer structure of the SiN film and the SiO film; the lower layer, which contacts with the oxide semiconductor film 105, is preferably the SiN film. The SiN film can be a supplier of hydrogen, thus, the resistance of the drain region and the source region of the oxide semiconductor 105 can be lowered.

In FIG. 5, the material for the side spacer 108 is preferably SiN because of requirement in microfabrication by dry etching as explained later; however, according to condition of fabrication, SiON (silicon nitride oxide) or SiO can be used. If the side spacer 108 is formed by SiN, the SiN in the interlayer insulating film and the SiN of the side spacer 108 can be the same material. However, the amount of hydrogen in the SiN of the interlayer insulating film 110 is larger than the amount of hydrogen in the SiN that constitutes the side spacer 108. Since the side spacer 108 is near to the channel, supplying hydrogen from the side spacer 108 is better to be suppressed.

Both of the SiN films are formed by CVD; even if the same gas pressure, power, deposition pressure and so forth are the same in the CVD for the two SiN films, when the SiN film for the side spacer 108 is formed, the deposition temperature is set higher, as e.g. 300 to 350 centigrade, than that for the SiN film for the interlayer insulating film 110. Since high temperature deposition has higher clearance coating properties, it has also merit that pores tend not to be included in the film.

Figure 6:
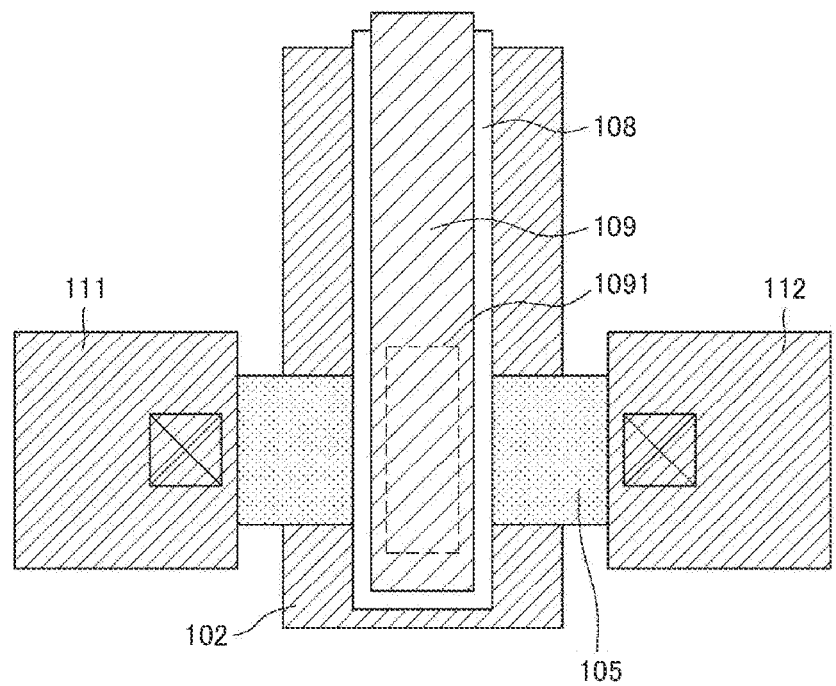
FIG. 6 is a plan view of the TFT portion according to embodiment 1.

FIG. 6 is a plan view of the TFT. In FIG. 6, the oxide semiconductor film 105 is formed on the bottom gate electrode 102 via the bottom gate insulating film. The island shaped gate insulating film is formed on the oxide semiconductor film 105, however, it is not seen because it is covered by the gate electrode 109 and the side spacer 108. In FIG. 6, the side spacer 108 is visible around the gate electrode 109; this corresponds to the tapered surface of the side spacer 108 in FIG. 5.

The recess 1091 is formed in the gate electrode 109. The channel 1051 of the oxide semiconductor film 105 is formed at the place corresponding to the recess 1091 of the gate electrode 109; the offset region 1052 of the oxide semiconductor film 105 is formed at the both sides of the recess 1091. In FIG. 6, the SiN film, which constitutes the interlayer insulating film 110, contacts to the oxide semiconductor film 105 at the place where the gate electrode 109 and the side spacer 108 do not overlap; consequently, the oxide semiconductor film 105 is reduced by hydrogen supplied from the SiN film, thus, the drain and the source are formed. The drain electrode 111 connects with the drain via the through hole and the source electrode 112 connects with the source via the through hole.

Figure 7:
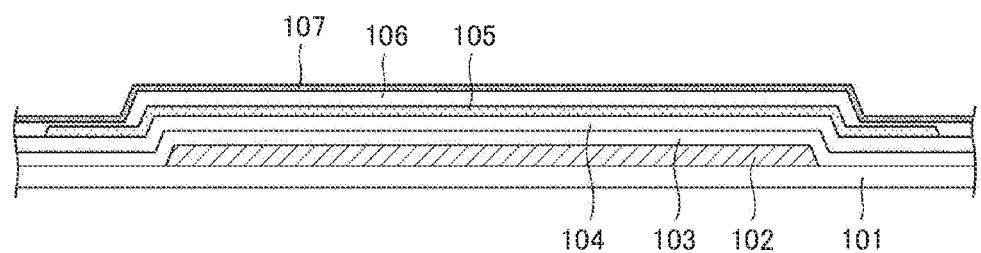
FIG. 7 is an interim cross sectional view in the manufacturing process of the TFT according to the present invention.

FIGS. 7 to 12 are interim cross sectional view in the manufacturing process for the structure of FIG. 5. FIG. 7 shows that: the bottom gate electrode 102 is formed on the undercoat film 101; the first bottom gate insulating film 103 and the second bottom gate insulating film 104 are formed covering the bottom gate electrode 102; and the oxide semiconductor film 105 is formed on the second bottom gate insulating film 104. The bottom gate electrode 102 is formed by sputtering, then patterned. The first bottom gate insulating film 103 is formed by SiN in a thickness of e.g. 50 nm; the second bottom gate insulating film 104 is formed by SiO in a thickness of e.g. 200 nm. The SiN film and the SiO film are continuously formed by CVD.

After that, the oxide semiconductor film 105 is formed on the second bottom gate insulating film 104. The oxide semiconductor film 105 is formed in a thickness of 10 to 100 nm, then it is patterned in island shape. Subsequently, top gate insulating film (gate insulating film) 106 is formed by SiO on the oxide semiconductor film 105. A thickness of the SiO film is e.g. 100 nm. The relation between the bottom gate insulating film and the top gate insulating film is explained in FIG. 2. Then, the AlO film 107 is formed by sputtering in a thickness of 10 to 50 nm.

Figure 8:
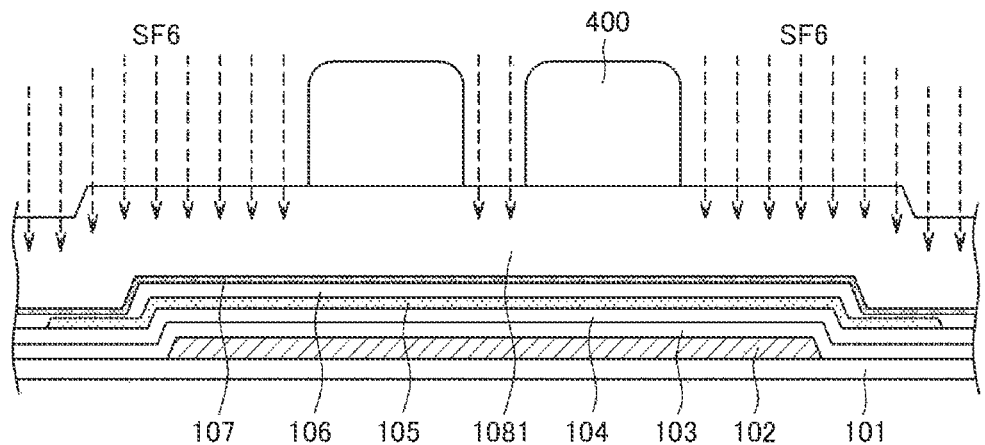
FIG. 8 is an interim cross sectional view that follows the process of FIG. 7.

FIG. 8 is an interim cross sectional view in the manufacturing process for the side spacer 108. In FIG. 8, the SiN film 1081 is formed by CVD in a thickness of 100 to 500 nm for the side spacer 108. The CVD for this SiN film is made at higher temperature (e.g. 300 to 350 centigrade) than the temperature of CVD for the SiN film for the interlayer insulating film 110, which is formed later. The reason is to form denser film to suppress the release of hydrogen from the side spacer 108. In FIG. 8, the resist 400 is formed for patterning the side spacer 108. After that, SiN film is dry etched using SF6 base gas.

Figure 9:
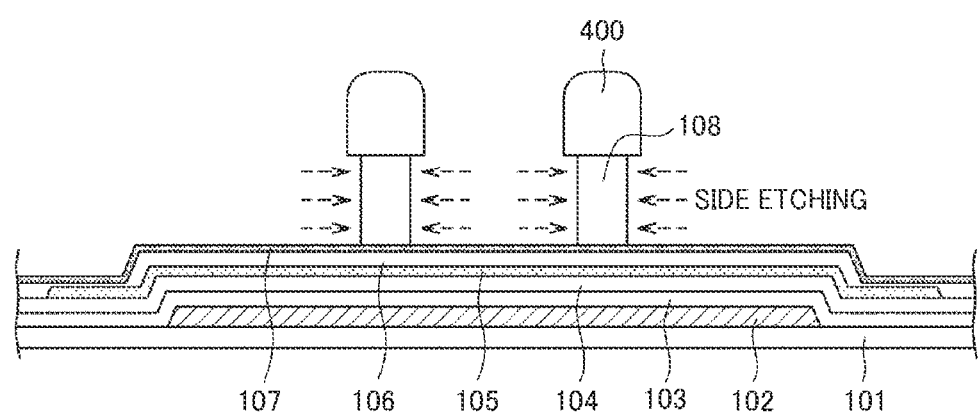
FIG. 9 is an interim cross sectional view that follows the process of FIG. 8.

FIG. 9 is a cross sectional view that the SiN film for the side spacer 108 is dry etched. The SiN film is easily side etched in dry etching using SF6 base gas. The side etching is shown by arrows in FIG. 9. The width of the side spacer becomes narrower than the width of the resist due to the side etching. Since the width of the side spacer 108 is very narrow as 0.5 to 2 microns at the bottom, it is difficult to form a resist in such a narrow pattern. The width of the side spacer 108 can be made less than the lower limit of patterning of the resist 400 by the effect of side etching if the SiN film is used for the side spacer 108.

In comparing the AlO film 107 and the SiN film 108, which is to constitute the side spacer 108, in dry etching of SF6 base gas, the selecting ratio of the dry etching between the AlO film 107 and the SiN film 1081 is so high; therefore, the AlO film 107 is not etched essentially in a dry etching in FIG. 9.

Figure 10:
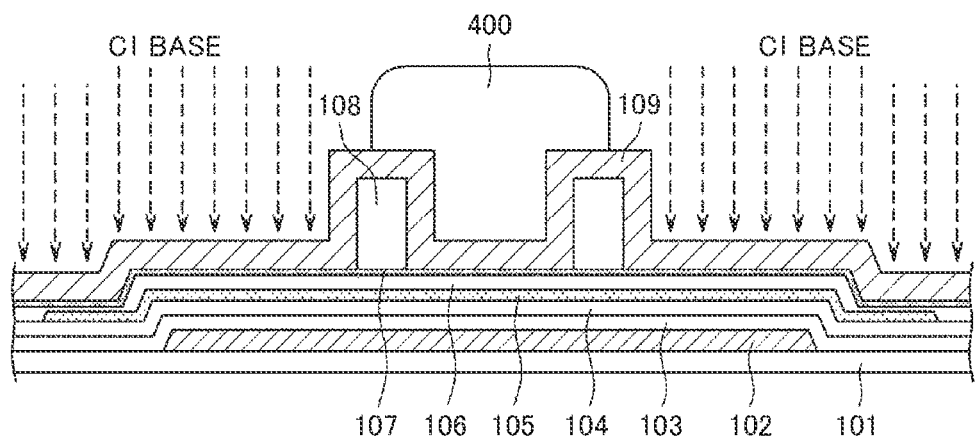
FIG. 10 is an interim cross sectional view that follows the process of FIG. 9.

After that as shown in FIG. 10, the metal or alloy for the gate electrode 109 is formed and the resist 400 is formed at the place of the gate electrode 109. The materials for the gate electrode 109 are e.g. Mo, MoW, or a lamination film of e.g. Ti—Al—Ti. Subsequently, the AlO film 107 and the gate electrode 109 are patterned by dry etching using Chlorine base gas. When Chlorine base gas is used, the SiO film, which constitutes the gate insulating film 106 is not easily etched, however, not zero, therefore, the dry etching using Chlorine gas is stopped during the SiO film is being dry etched.

Figure 11:
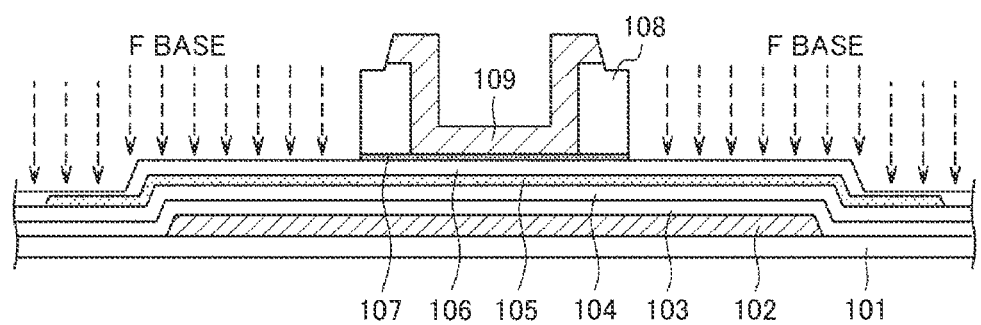
FIG. 11 is an interim cross sectional view that follows the process of FIG. 10.

FIG. 11 is a cross sectional view that the gate electrode 109 and the AlO film 107 have been patterned by dry etching using Chlorine gas as shown in FIG. 10. In this state, the oxide semiconductor film 105 is covered by the gate insulating film 106. Therefore, as shown in FIG. 11, the SiO film is patterned by dry etching using SF6 base gas to form the gate insulating film 106. The oxide semiconductor film 105 is not essentially etched by dry etching using SF6 base gas.

Figure 12:
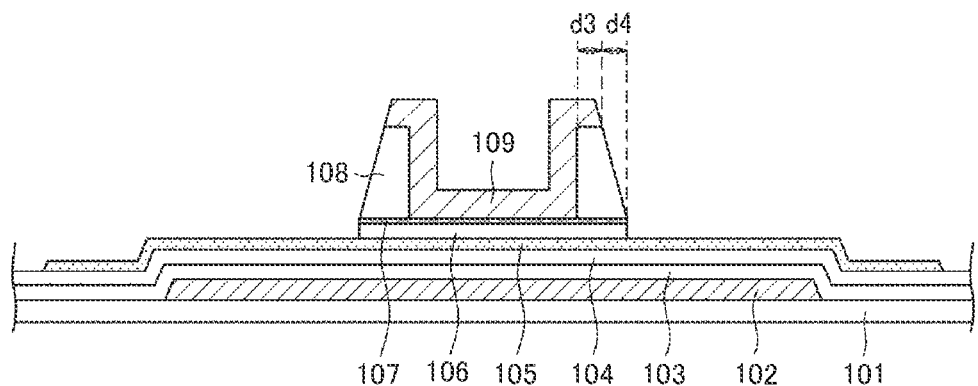
FIG. 12 is an interim cross sectional view that follows the process of FIG. 11.

FIG. 12 is a cross sectional view that the gate insulating film 106 is formed by eliminating unnecessary SiO film by dry etching using SF6 base gas. The SiN that constitutes the side spacer 108 is also slightly etched by dry etching using SF6 base gas, thus, the outer surface of the side spacer 108 is to have a taper.

In FIG. 12, the gate electrode 109 exends on the top side of the side spacer 108, whose cross sectional view is trapezoidal. This amount (length) of the gate electrode 109 on the top of the side spacer 108 is d3, which is preferably 0.1 microns or more. The difference between the top side and the bottom side of the side spacer 108 is preferably 0.3 microns or more.

Subsequently, when the interlayer insulating film 110 is formed on the structure of FIG. 12, the structure of FIG. 5 is realized. The interlayer insulating film 110 is formed by the SiN film or the laminated film of the SiO film and the SiN film; when the laminated film is used, the SiN film is preferably the lower layer, which contacts the oxide semiconductor film 105, to supply hydrogen to the oxide semiconductor 105. The SiN that constitutes the interlayer insulating film 110 preferably contains more hydrogen than that of the SiN that constitutes the side spacer 108.

Embodiment 2

Figure 13:
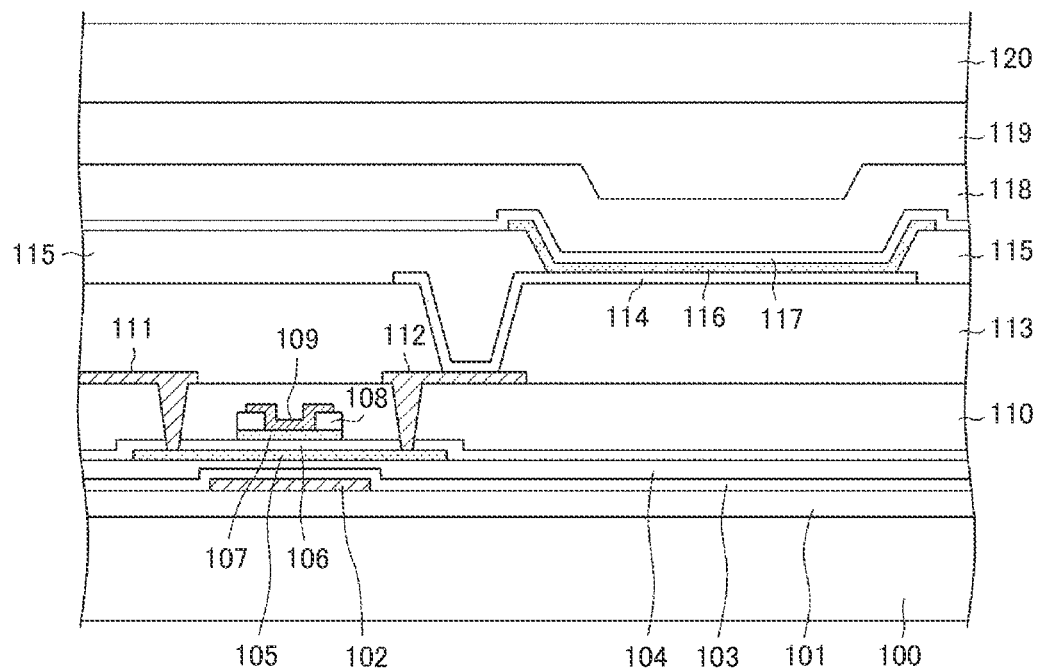
FIG. 13 is a cross sectional view of the organic EL display device according to embodiment 2.

FIG. 13 is a cross sectional view of the display area of the organic EL display device according to embodiment 2. In FIG. 13, the top gate insulating film 106 is formed not only under the gate electrode 109, but formed also all over the display area. In addition, the side surface of the side spacer 108 is not tapered. Other structures of FIG. 13 is the same as FIG. 4. In FIG. 13, the interlayer insulating film 110 does not contact with the drain region and the source region of the oxide semiconductor film 105. Therefore, they cannot receive hydrogen from the interlayer insulating film 110 even it is formed by SiN. Therefore, the ion implantation (I/I) is performed to form the drain region and the source region in the oxide semiconductor film 105 as shown in FIG. 14.

Figure 14:
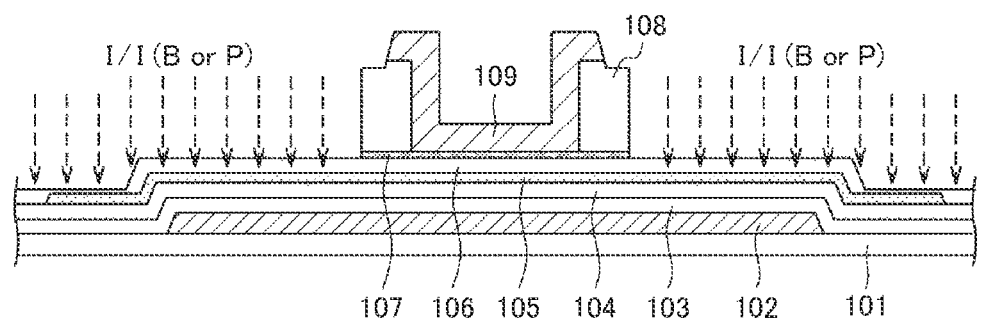
FIG. 14 is an interim cross sectional view in the manufacturing process of the TFT according to embodiment 2.

The cross sectional structure of FIG. 14 is the same as FIG. 11 of embodiment 1. In FIG. 14, however, the dry etching is not performed, but the ion implantation (I/I) is performed to give the conductivity to the oxide semiconductor film 105 by doping Boron (B) or Phosphorous (P) and so forth to form the drain and the source in the oxide semiconductor film 105. By the way, the ion implantation (I/I) gives the conductivity by forming defects in the structure of the oxide semiconductor film 105, thus, the atoms for the ion implantation can be Ar and so forth. The ion implantation (I/I) is performed using the gate electrode 109 as the mask. In addition, the side spacer 108 is made thick, and the AlO film 107 exists in this area; therefore, the intermedium region is formed between the channel and the drain or the source. In the meantime, the side spacer 108 is not etched by the ion implantation (I/I), therefore, a tapered side surface, as depicted in FIG. 12, is likely not formed.

Figure 15:
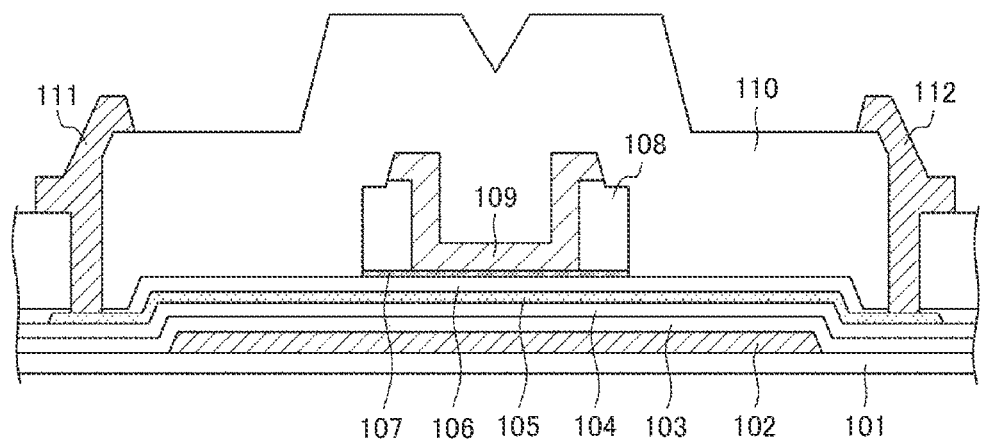
FIG. 15 is a cross sectional view of the completed TFT according to embodiment 2.

FIG. 15 is a cross sectional view that: after the ion implantation (I/I), the interlayer insulating film 110 is formed, through holes are formed in the interlayer insulating film 110, and drain electrode 111 and the source electrode 112 are connected to the oxide semiconductor film 105 via the through holes. The structure of the interlayer insulating film 110 is the same as explained in FIG. 5 and so forth in embodiment 1. In embodiment 2, the drain region and the source region get conductivity through ion implantation (I/I).

The drain region and the source region of the oxide semiconductor film 105 are covered by the gate insulating film 106, which has a lot of oxygen. Therefore, it is possible that the resistance of the drain region and the source region gradually increases even they are given conductivity by ion implantation (I/I).

This phenomenon is mitigated by setting the SiN film of the interlayer insulating film 110 in contact with the gate insulating film 106; namely, hydrogen from the SiN film of the interlayer insulating film 110 mitigates the effect of oxygen from the gate insulating film 106 to the drain and the source of the oxide semiconductor film 105. Therefore, characteristics of the TFT can be stabilized. Other structures are the same as explained in embodiment 1.

Embodiment 3

Figure 16:
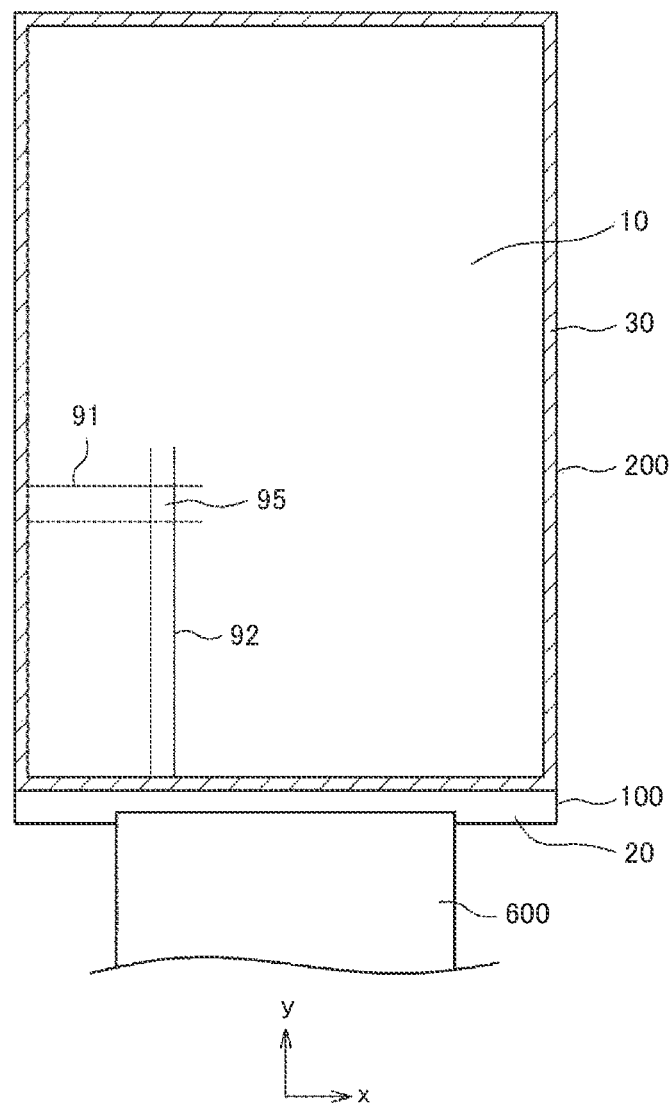
FIG. 16 is a plan view of the liquid crystal display device.

In embodiment 1 and embodiment 2, the present invention is explained when it is applied to the organic EL display device. The present invention, however, can be applied to the liquid crystal display device. FIG. 16 is a plan view of the liquid crystal display device. In FIG. 16, the TFT substrate 100 and the counter substrate 200 are adhered by the seal material 30; the liquid crystal is sealed inside of the seal material 30.

The display area 10 is formed where the TFT substrate 100 and the counter substrate 200 overlap. In the display area 10, the scan lines 91 extend in the lateral direction (x direction) and are arranged in the longitudinal direction (y direction); the video signal lines 92 extend in the longitudinal direction and are arranged in the lateral direction. The pixel 95 is formed in the area surrounded by the scan lines 91 and the video signal lines 92. The TFT substrate 100 is made bigger than the counter substrate 200; the area that the TFT substrate 100 does not overlap with the counter substrate 200 is the terminal area 20. The flexible wiring substrate 600 is connected to the terminal area 20 to supply powers and signals to the liquid crystal display device.

Figure 17:
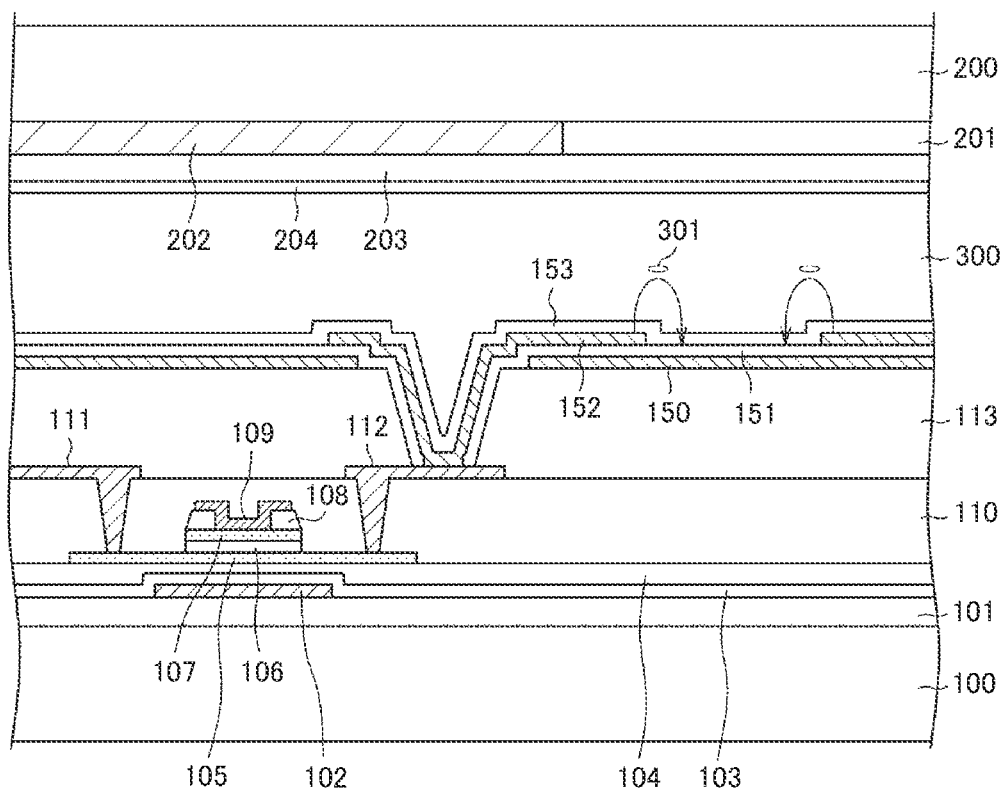
FIG. 17 is a cross sectional view of the liquid crystal display device according to the present invention.

FIG. 17 is a cross sectional view of the display area 10 of the liquid crystal display device. In FIG. 17, the structure is the same up to forming the organic flattening film 110 as FIG. 4 in embodiment 1. By the way, the TFT in FIG. 4 in embodiment 1 is a driving TFT that drives the organic EL layer, and the TFT in this embodiment is a switching TFT, however, the basic structure is the same.

In FIG. 17, the two-layer structured bottom gate insulating film 103, 104 is formed on the first gate electrode 102, which can work also as the light shading film; the oxide semiconductor film 105 is formed on the bottom gate insulating film 103, 104. The top gate insulating film 106 is formed on the oxide semiconductor film 105 at the place corresponding to the channel. The AlO film 107 is formed on the top gate insulating film 106. Subsequently, the side spacers 108, which characterize the present invention, are formed on the AlO film 107 at its both sides. After that the gate electrode 109 is formed.

The interlayer insulating film 110 is formed covering the gate electrode 109, the side spacers 108, and the oxide semiconductor film 105 and so forth. The structure of the interlayer insulating film 110 is also the same as in explained in FIG. 5. Subsequently, the through holes are formed in the interlayer insulating film 110 to connect the drain of the oxide semiconductor film 105 and the drain electrode 111 and to connect the source of the oxide semiconductor film 105 and the source electrode 112. The organic flattening film 113 is formed covering the drain electrode 111, the source electrode 112 and the interlayer insulating film 110.

In FIG. 17, the structures formed later than the organic flattening film 113 are different from the organic EL display device of FIG. 4. FIG. 17 is a cross sectional view of the liquid crystal display device of IPS (In Plane Switching) mode. In FIG. 17, the through hole is formed in the organic flattening film 113 to connect the source electrode 112 and the pixel electrode 152. In FIG. 17, the common electrode 150 of the ITO is formed on the organic flattening film 113. The capacitance insulating film 151 is formed by SiN on the common electrode 150.

The pixel electrode 152 is formed on the capacitance insulating film 151. The pixel electrode 152 connects with the source electrode 112 via the through hole formed in the organic flattening film 113. By the way, the capacitance insulating film 151 covers the side wall of the through hole in the organic flattening film 113, however, the through hole is formed in the capacitance insulating film 151 at the bottom so that the pixel electrode 152 can connect with the source electrode 112. The alignment film 153 is formed on the pixel electrode 152 to give an initial alignment to the liquid crystal molecules 301.

The counter substrate 200 is formed opposing to the TFT substrate 100 sandwiching the liquid crystal layer 300. On the inside surface of the counter substrate 200, the black matrix 202 is formed, and the color filter 201 is formed at the place corresponding to the pixel electrode 152. The overcoat film 203 is formed covering the black matrix 202 and the color filter 201. The alignment film 204 is formed on the overcoat film 203 to give an initial alignment to the liquid crystal molecules 301.

In FIG. 17, when the voltage is applied to the pixel electrode 152, the lines of force as shown by the arrows are generated to rotate the liquid crystal molecules 301, consequently, light transmittance in the pixel is controlled and thus, the images are formed.

As described above, the TFT of oxide semiconductor having stable characteristics can be realized by applying the structure explained in embodiment 1. The structure of embodiment 2 can also be applied to the liquid crystal display device.

The above explanation is made for the IPS mode liquid crystal display device; however, the present invention can be applied to other modes of the liquid crystal display device.

The TFT of the oxide semiconductor can make the leak current low, however, the mobility of the carriers is low compared with that of the polysilicon semiconductor; therefore, sometimes, it may be difficult to form the peripheral driving circuit, as e.g. the scan line driving circuit 80, by the TFTs of the oxide semiconductors. In such a case the TFTs of the polysilicon semiconductors can be used in the peripheral driving circuits.

On the other hand, the TFT of the polysilicon semiconductor has a higher leak current, therefore, a voltage change in the pixel electrode becomes a problem. Thus, it is reasonable to use the TFTs of the oxide semiconductors in the pixels in the display area, and to use the TFTs of the polysilicon semiconductors in the peripheral driving circuit. Such a structure can be called as a hybrid type; the present invention can be applied to the highbred type devices, too.

What is claimed is:

1. A semiconductor device having thin film transistors comprising: oxide semiconductor film, drain, source, a gate insulating film formed on the oxide semiconductor film, an aluminum oxide film formed on the gate insulating film, a gate electrode and a side spacer formed on the aluminum oxide film, and an interlayer insulating film formed on the gate electrode, the side spacer, the drain and the source, wherein in a plan view, and in a direction from the drain to the source, a length of the gate electrode is shorter than a length of the aluminum oxide film, the gate electrode covers an inner surface of the side spacer and a top surface of the side spacer, a side surface, which contacts with the interlayer insulating film, of the side spacer is a tapered surface.

2. The semiconductor device according to claim 1, wherein a length, in the direction from the drain to the source, of the gate electrode on the top of the side spacer is 0.1 microns or more.

3. The semiconductor device according to claim 1, wherein the oxide semiconductor film has a channel, which is formed between the drain and the source,
an intermediate region is formed between the channel and the drain and between the channel and the source,
a gate insulating film is formed on the channel and the intermediate region of the oxide semiconductor film,
the gate electrode is formed on the aluminum oxide film above the channel, and
a content of hydrogen in the oxide semiconductor film, is: in the channel<in the intermediate region<in the drain or the source.

4. The semiconductor device according to claim 1, wherein a content of hydrogen in the interlayer insulating film is higher than a content of hydrogen in the side spacer.

5. The semiconductor device according to claim 1, wherein a height of the side spacer is 100 to 500 nm.

* * * * *